(12) United States Patent
Taniguchi

(10) Patent No.: US 8,482,366 B2
(45) Date of Patent: Jul. 9, 2013

(54) LAMINATED BALANCE FILTER

(75) Inventor: Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 419 days.

(21) Appl. No.: 12/944,810

(22) Filed: Nov. 12, 2010

(65) Prior Publication Data

US 2011/0140806 A1 Jun. 16, 2011

(30) Foreign Application Priority Data

Dec. 11, 2009 (JP) ................................. 2009-282130

(51) Int. Cl.
 *H03H 7/00* (2006.01)
(52) U.S. Cl.
 USPC .............................. 333/185; 333/25; 333/204
(58) Field of Classification Search
 USPC ........................................... 333/25, 185, 204
 See application file for complete search history.

(56) References Cited

U.S. PATENT DOCUMENTS

| 7,126,444 | B2 * | 10/2006 | Fukunaga et al. ............ 333/204 |
| 2002/0171510 | A1 | 11/2002 | Kushitani et al. |
| 2003/0038689 | A1 | 2/2003 | Yamaguchi |
| 2007/0241839 | A1 | 10/2007 | Taniguchi |

FOREIGN PATENT DOCUMENTS

| CN | 1402578 A | 3/2003 |
| JP | 09-260146 A | 10/1997 |
| JP | 2002-217616 A | 8/2002 |
| JP | 2002-261561 A | 9/2002 |
| JP | 2003-273686 A | 9/2003 |
| JP | 2004-320561 A | 11/2004 |
| JP | 2005-045447 A | 2/2005 |
| WO | 2007/119356 A1 | 10/2007 |

OTHER PUBLICATIONS

Official Communication issued in corresponding Japanese Patent Application No. 2009-282130, mailed on Jan. 31, 2012.

* cited by examiner

*Primary Examiner* — Benny Lee
*Assistant Examiner* — Rakesh Patel
(74) *Attorney, Agent, or Firm* — Keating & Bennett, LLP

(57) ABSTRACT

A laminated balance filter includes a first capacitor electrode and a ground electrode that are disposed opposite to each other to define a capacitor at an unbalanced side. An unbalanced side coil is provided in a dielectric layer. Three balanced side coils are provided in three dielectric layers. The three balanced side coils preferably have a substantially helical shape and are wound in the same winding directions. The coil located in the center of the three balanced side coils is disposed near the unbalanced side coil so as to be electromagnetic-field-coupled to the unbalanced side coil.

10 Claims, 13 Drawing Sheets

LAMINATED BALANCE FILTER

BACKGROUND OF THE INVENTION

1. Field of the Invention

The present invention relates to a laminated balance filter having a multilayer body including a plurality of dielectric layers and a plurality of electrode layers.

2. Description of the Related Art

In recent years, high-frequency band pass filters having a reduced size and cost include a plurality of LC resonators in a multilayer body in which a dielectric layer and an electrode layer are laminated. An example of such a multilayer band pass filter is disclosed in Japanese Unexamined Patent Application Publication No. 2005-45447. The configuration of a multilayer band pass filter disclosed in Japanese Unexamined Patent Application Publication No. 2005-45447 will be described with reference to FIG. 1.

FIG. 1 is a circuit diagram of the multilayer band pass filter disclosed in Japanese Unexamined Patent Application Publication No. 2005-45447. A multilayer band pass filter 1 includes an unbalanced input 2, balanced outputs 3A and 3B, and a band pass filter unit 4 arranged between the unbalanced input 2 and the balanced outputs 3A and 3B. The band pass filter unit 4 includes three resonators 40 that are ½ wavelength resonators 40, both ends of which are open, and arranged next to one another. An input resonator 401 is arranged at a location closest to the unbalanced input 2. The unbalanced input 2 is directly connected to the input resonator 401. A balanced output ½ wavelength resonator 41A is arranged at a location closest to the balanced outputs 3A and 3B. The balanced outputs 3A and 3B are directly connected to the balanced output ½ wavelength resonator 41A. The input resonator 401 and an intermediate resonator 40M are electromagnetically coupled to each other, and the intermediate resonator 40M and the balanced output ½ wavelength resonator 41A are also electromagnetically coupled to each other. In addition, capacitors C are provided between the individual open ends of the three resonators 40 and a ground.

In the multilayer band pass filter disclosed in Japanese Unexamined Patent Application Publication No. 2005-45447, a plurality of λ/2 resonators, both ends of which are open, are disposed on the same substrate surface, and, by coupling the resonators to one another, a balanced-unbalanced conversion function and filter characteristics are obtained.

In a filter that has the balanced-unbalanced conversion function, the balanced terminal thereof is typically connected to an IC that inputs and outputs a signal in a balanced manner. In such a case, it is necessary to convert impedance between an unbalanced terminal and a balanced terminal. However, since balance characteristics are obtained using stripline coupling in the structure illustrated in Japanese Unexamined Patent Application Publication No. 2005-45447, it is difficult to selectively design the impedance.

Since a ½ wave length stripline is used to balance the characteristics, it is difficult to reduce the size thereof. In addition, if an impedance converting circuit is provided, an area occupied by the impedance converting circuit increases, and thus, it is difficult to reduce the size of the filter.

SUMMARY OF THE INVENTION

To overcome the problems described above, preferred embodiments of the present invention provide a laminated balance filter that is easily reduced in size and that can perform predetermined impedance conversion between an input and an output.

According to a preferred embodiment of the present invention, a laminated balance filter preferably includes a plurality of dielectric layers, a plurality of electrode layers, a plurality of longitudinal conducting electrodes that penetrate the dielectric layers in thickness directions thereof, one unbalanced terminal, two balanced terminals, and a ground terminal, wherein a ground electrode, a balanced side inductor, an unbalanced side inductor, and an unbalanced side capacitor electrode are defined by the electrode layers and the longitudinal conducting electrodes.

Preferably, the ground electrode is conductively connected to the ground terminal, a first end portion of the unbalanced side inductor is conductively connected to the unbalanced terminal, and a second end portion of the unbalanced side inductor is conductively connected to the ground electrode. Preferably, the unbalanced side capacitor electrode is arranged at a location opposite to the ground electrode and is conductively connected to the unbalanced terminal.

Preferably, the balanced side inductor includes a series circuit in which an odd number of inductors, including at least three inductors, are connected in series, and a first end portion and a second end portion of the inductor series circuit are conductively connected to the two balanced terminals, respectively, and a center inductor of the odd number of inductors is arranged at a location at which the center inductor is electromagnetic-field-coupled to the unbalanced side inductor, and the odd number of inductors include substantially helical-shaped coils that are wound in the same winding directions.

In this manner, an odd number of inductors are arranged at the balanced side, and the center inductor of the odd number of inductors is arranged near a location at which the center inductor is electromagnetic-field-coupled to the unbalanced side inductor. Accordingly, a passband width can be designed based on a coupling amount between inductors. The coupling between the inductors can be determined based on the facing lengths of the coils included in the inductors and a thickness between patterns, and thus, a passband width is easily designed.

In addition, an LC resonator at the unbalanced side and a helical coil at the balanced side are partially coupled to each other, and thus, the impedance of a coil at the balanced side can be freely designed because the coil is not subjected to a main coupling. Accordingly, there is a lot of flexibility for the design of impedance at a balanced side port.

In addition, since a balanced side coil can preferably be defined by the helical coil, a coil that has a desired inductance and a high Q value and a reduced size is obtained. Accordingly, a filter that has a small insertion loss is obtained.

For example, at least a portion of a coil included in the center inductor is preferably disposed in the uppermost layer or the lowermost layer of a plurality of electrode layers in which the balanced side inductors are provided.

Accordingly, the coil included in the center inductor of the balanced side inductors can preferably be arranged without being expanded in a planar direction, and thus, the size of the device can be further reduced.

For example, the coil included in the center inductor is preferably arranged near a coil included in the unbalanced side inductor at least a portion of which overlaps in a laminating direction of the plurality of electrode layers with the coil included in the center inductor.

Accordingly, the thickness of dielectric or the area of the overlapping portions of the two coils included in the individual inductors is fixed, thereby providing the most suitable electromagnetic coupling. In addition, by coupling the two coils to each other in a thickness direction, the size of a multilayer body in a plane direction is reduced.

For example, the coil included in the center inductor preferably protrudes, with respect to the laminating direction of the plurality of electrode layers, from forming regions of coils included in other inductors in the balanced side inductors, and the unbalanced side inductor is arranged near the protruding portion with respect to the laminating direction of the protruding portion.

Accordingly, the coupling between the center inductor of the balanced side inductors and the unbalanced side inductor can be easily fixed based on the facing lengths of the coils included in the individual inductors and the thickness of a dielectric layer between the coils.

For example, the coil included in the unbalanced side inductor is preferably defined by the plurality of electrode layers, and an electrode layer in which the coil included in the center inductor is provided is sandwiched between the plurality of electrode layers in which the coil included in the unbalanced side inductor is defined.

Accordingly, the coupling between the center inductor of the balanced side inductors and the unbalanced side inductor is effectively increased, and thus, wide bandwidth characteristics are easily obtained.

For example, the coil included in the center inductor is preferably defined by the plurality of electrode layers, and an electrode layer in which the coil included in the unbalanced side inductor is provided is sandwiched between the plurality of electrode layers in which the coil included in the center inductor is defined.

Accordingly, the coupling between the center inductor of the balanced side inductors and the unbalanced side inductor can be increased, and hence wide bandwidth characteristics can be easily obtained.

For example, the coil included in the center inductor and the coil included in the unbalanced side inductor are preferably arranged near each other in an in-plane direction of the same electrode layer at a location at which the two coils are electromagnetically coupled to each other.

Accordingly, the deviation of a coupling amount due to misalignment of the electrode layers that sandwich the dielectric layer does not occur, and thus, a stable degree of coupling is provided.

For example, the coil included in the unbalanced side inductor is preferably defined by the plurality of electrode layers, and the coil included in the unbalanced side inductor is connected using the longitudinal conducting electrode.

Accordingly, the size of the inductor at the unbalanced side is reduced, thereby reducing the area of the base of the device.

For example, the unbalanced side inductor is preferably defined by a substantially spiral-shaped coil, the axis of which corresponds to a laminating direction of the plurality of electrode layers.

Accordingly, the inductance of the unbalanced side inductor is increased, thereby increasing the impedance at the unbalanced side.

For example, two balanced side capacitor electrodes, which are arranged at locations opposing the ground electrode and are conductively connected to the two balanced terminals, respectively, are defined by a predetermined electrode layer of the plurality of electrode layers.

Accordingly, a desired passband can be designed based on the setting of the capacity of the balanced side capacitor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
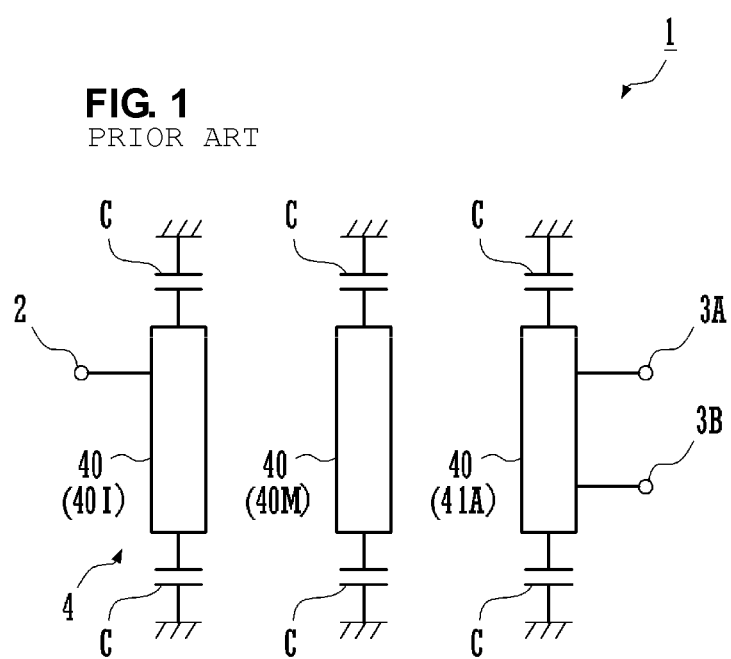
FIG. 1 is a circuit diagram of a multilayer band pass filter disclosed in Japanese Unexamined Patent Application Publication No. 2005-45447.
Figure 2:
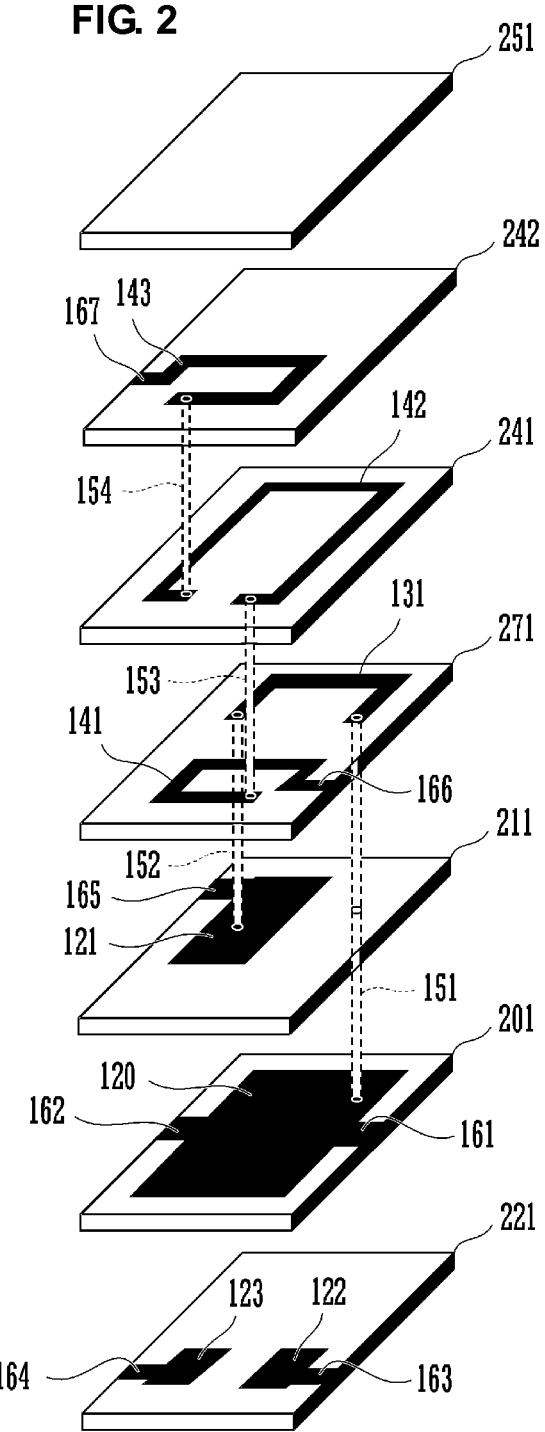
FIG. 2 is an exploded perspective view of a laminated balance filter according to a first preferred embodiment of the present invention.

A laminated balance filter according to a first preferred embodiment of the present invention will be described with reference to FIGS. 2 to 4. FIG. 2 is an exploded perspective view of the laminated balance filter according to the first preferred embodiment of the present invention.

As illustrated in FIG. 2, the laminated balance filter includes a multilayer body including a plurality of laminated dielectric layers 251, 242, 241, 271, 211, 201, and 221 on which electrode patterns are provided. When the multilayer body is formed by firing, a plurality of dielectric green sheets in which electrode patterns are individually provided are laminated, pressed, and fired. Therefore, while the dielectrics after firing are combined, the dielectrics do not necessarily define individual layers. However, since a dielectric having a predetermined thickness is disposed between adjacent electrode layers, it may be assumed that a dielectric layer and an electrode layer are laminated in the multilayer body. This point is also applicable to the other preferred embodiments of the present invention described below.

In the dielectric layer 211, a first capacitor electrode 121 that corresponds to an "unbalanced side capacitor electrode" according to preferred embodiments of the present invention is provided. The capacitor electrode 121 extends to the left side of the dielectric layer 211 through an extraction electrode 165. A ground electrode 120 is provided in the dielectric layer 201. The ground electrode 120 extends to the right and left sides of the dielectric layer 201 through extraction electrodes 161 and 162. A second capacitor electrode 122 and a third capacitor electrode 123 are individually provided in the dielectric layer 221. The second capacitor electrode 122 extends to the right side of the dielectric layer 221 through an extraction electrode 163. The third capacitor electrode 123 extends to the left side of the dielectric layer 221 through an extraction electrode 164.

The first capacitor electrode 121 and the ground electrode 120 are arranged opposite to each other, thereby configuring a first capacitor. The second capacitor electrode 122 and the ground electrode 120 are disposed opposite each other, thereby defining a second capacitor. In the same manner, the third capacitor electrode 123 and the ground electrode 120 are arranged opposite to each other, thereby defining a third capacitor.

In the dielectric layer 271, a coil (hereinafter referred to as "unbalanced side coil") 131 included in the unbalanced side inductor is provided.

In the dielectric layer 271 and the dielectric layer 211, a "longitudinal conducting electrode" (hereinafter referred to as "via electrode") 151 according to the preferred present embodiment is provided. A first end portion of the unbalanced side coil 131 in the dielectric layer 271 is conductively connected to the ground electrode 120 in the dielectric layer 201 through the via electrode 151.

A via electrode 152 is provided in the dielectric layer 271. A second end portion of the unbalanced side coil 131 is conductively connected to the first capacitor electrode 121 in the dielectric layer 211 through the via electrode 152.

The first capacitor electrode 121 and the ground electrode 120 define an unbalanced side capacitor. An LC parallel resonator is defined by the unbalanced side capacitor, the unbalanced side coil 131, and the via electrodes 151 and 152.

In addition, a coil (hereinafter referred to as "balanced side coil") 141 included in a balanced side inductor is provided in the dielectric layer 271, a balanced side coil 142 is provided in the dielectric layer 241, and a balanced side coil 143 is provided in the dielectric layer 242. A via electrode 153 and a via electrode 154 are provided in the dielectric layer 241 and the dielectric layer 242, respectively.

A first end portion of the balanced side coil 141 extends to the right side of the dielectric layer 271 through an extraction electrode 166. A second end portion of the balanced side coil 141 is conductively connected to a first end portion of the balanced side coil 142 through the via electrode 153. A second end portion of the balanced side coil 142 is conductively connected to a first end portion of the balanced side coil 143 through the via electrode 154. A second end portion of the balanced side coil 143 extends to the left side of the dielectric layer 242 through the extraction electrode 167.

The balanced side coils 141, 142, and 143 preferably have a substantially helical shape such that the winding directions of the individual coils are arranged in the same direction. The coil 142 arranged in the center of the three balanced side coils 141, 142, and 143 is disposed near the unbalanced side coil 131, thereby being electromagnetic-field-coupled to the unbalanced side coil 131.

Figure 3:
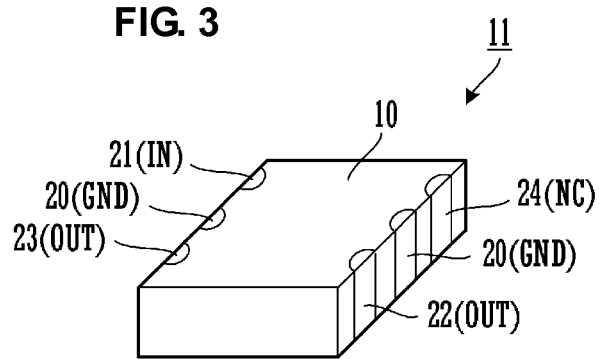
FIG. 3 is a perspective view of the laminated balance filter according to the first preferred embodiment of the present invention.

FIG. 3 is a perspective view of a laminated balanced filter 11 according to the first preferred embodiment.

By laminating the dielectric layers 251, 242, 241, 271, 211, 201, and 221 in which various types of electrode patterns are provided, as illustrated in FIG. 2, a multilayer body 10 is configured as illustrated in FIG. 3. A ground terminal 20, an unbalanced input terminal 21, balanced output terminals 22 and 23, and an open terminal 24 are disposed on two opposing side surfaces (end surfaces) of four side surfaces of the multilayer body, thereby providing laminated balance filter 11. The multilayer body 10 preferably has a size of about 1.6 mm×about 0.8 mm and a height of about 0.5 mm, for example.

The dielectric portion of the dielectric layer preferably has a relative permittivity in the range from about 6 to about 80, for example. Each of the dielectric layers is preferably made of, for example, low temperature co-fired ceramics (LTCC), the relative permittivity $\in$r of which is preferably substantially equal to about 23.5 that is made of a glass component and at least one component of titanium oxide, barium oxide, alumina, or other suitable material, for example. Alternatively, each of the dielectric layers may preferably be made of, for example, a resin, such as a liquid crystal polymer (LCP), a polyimide, or other suitable material.

The above-described material from which each dielectric layer is preferably made is also applicable to that in other preferred embodiments of the present invention described below.

Figure 4:
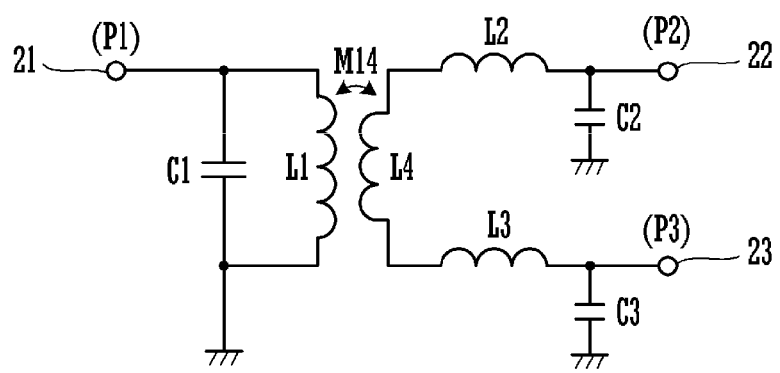
FIG. 4 is an equivalent circuit diagram of the laminated balance filter according to the first preferred embodiment of the present invention.

FIG. 4 is an equivalent circuit diagram of the laminated balance filter illustrated in FIGS. 2 and 3. In FIG. 4, an inductor L1 corresponds to the unbalanced side inductor that includes the via electrodes 151 and 152 and the unbalanced side coil 131, illustrated in FIG. 2. In FIG. 4, an inductor L4 corresponds to the center coil 142 located in the center of the three balanced side coils illustrated in FIG. 2. An inductor L2 corresponds to the coil that includes the balanced side coil 141 and the via electrode 153, illustrated in FIG. 2. Similarly, an inductor L3 corresponds to the coil that includes the balanced side coil 142 and the via electrode 154, illustrated in FIG. 2.

In addition, in FIG. 4, a capacitor C1 corresponds to the first capacitor defined by the first capacitor electrode 121 and the ground electrode 120. A capacitor C2 corresponds to the second capacitor defined by the second capacitor electrode 122 and the ground electrode 120. In the same manner, a capacitor C3 corresponds to the third capacitor defined by the capacitor electrode 123 and the ground electrode 120.

An LC parallel resonator includes the inductor L1 and the capacitor C1 illustrated in FIG. 4. In addition, when it is assumed that the midpoint of the inductor L4 is a virtual ground, an LC parallel resonator is defined by one half of the inductor L4, the inductor L2, and the capacitor C2. Similarly, an LC parallel resonator is defined by the other half of the inductor L4, the inductor L3, and the capacitor C3.

A coupling coefficient M14 between the inductor L1 and the inductor L4 represents a main coupling that functions as a balanced-unbalanced transformer. Coupling between the inductor L1 and the inductor L2 and coupling between the inductor L1 and the inductor L3 are parasitic coupling, and the coupling coefficients thereof are relatively small as compared to the coupling coefficient M14 between the inductor L1 and the inductor L4. The inductors L2 and L3 and the capacitors C2 and C3 function as an impedance matching and conversion circuit.

According to the first preferred embodiment, the following advantageous effects are obtained.

The coil 142 arranged in the center of the balanced side coils 141, 142, and 143 is disposed near the unbalanced side coil 131, thereby allowing a passband width to be designed based on a coupling amount between inductors.

The LC resonator at the unbalanced side and the helical coil at the balanced side are partially coupled to each other, and thus, the impedance of a coil that is not subjected to the main coupling can be designed. In addition, since the impedance of a balanced side port can be set by fixing ratios of L1 and L2 to C2 and C3, the design flexibility for setting the impedance is improved.

Since the balanced side coil is preferably defined by the helical coil, a coil that has a desired inductance and a high Q value can be configured so as to have a reduced size. Accordingly, a filter that has a small insertion loss is obtained.

The coil 142 located in the center of the three balanced side coils 141, 142, and 143 preferably protrudes, in plan view of the multilayer body (a state in which the plane of each of layers is viewed in a direction perpendicular or substantially perpendicular thereto), from regions in which the other coils 141 and 143 are located at the balanced side coil, and the unbalanced side coil 131 is arranged near the protruding portion with respect to a laminating direction of the protruding portion. Accordingly, the coupling between the center coil 142 located in the center of the balanced side coils and the unbalanced side coil 131 can be easily set based on the facing lengths of the two coils and the thickness of a dielectric layer between the coils.

Since the center coil 142 located in the center of the balanced side coils is disposed near a location at which at least a portion of the coil overlaps, in the laminating direction of electrode layers, with the unbalanced side coil 131, the thickness of the dielectric layer or the area of overlapping portions of two coils is fixed so as to obtain desired electromagnetic coupling. In addition, by coupling the two coils to each other in a thickness direction, the size of a multilayer body in a planar direction can be reduced.

Since, in plan view of the multilayer body, the patterns of the balanced side coils are preferably line-symmetric with respect to a symmetrical axis corresponding to a line that is perpendicular or substantially perpendicular to a line drawn from one of the two balanced output terminals to the other of the two balanced output terminals, highly balanced characteristics are obtained.

Second Preferred Embodiment

Figure 5:
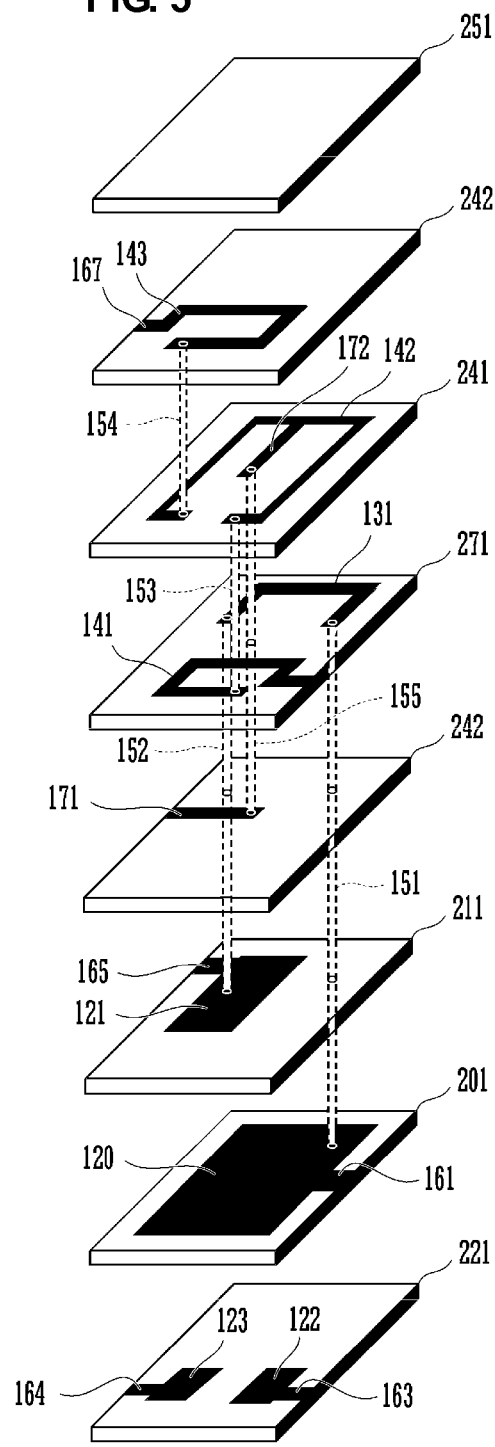
FIG. 5 is an exploded perspective view of a laminated balance filter according to a second preferred embodiment of the present invention.

FIG. 5 is an exploded perspective view of a laminated balance filter according to a second preferred embodiment of the present invention.

As illustrated in FIG. 5, the laminated balance filter includes a multilayer body including a plurality of laminated dielectric layers 251, 242, 241, 271, 242, 211, 201, and 221 in which electrode patterns are provided.

The laminated balance filter is different from the laminated balance filter according to the first preferred embodiment illustrated in FIG. 2 in that the center of the center coil 142 located in the center of the three balanced side coils extends to the left side of the dielectric layer 242 through extraction electrodes 171 and 172 and a via electrode 155.

The remaining configuration is the same or substantially the same as that of the first preferred embodiment.

Figure 6:
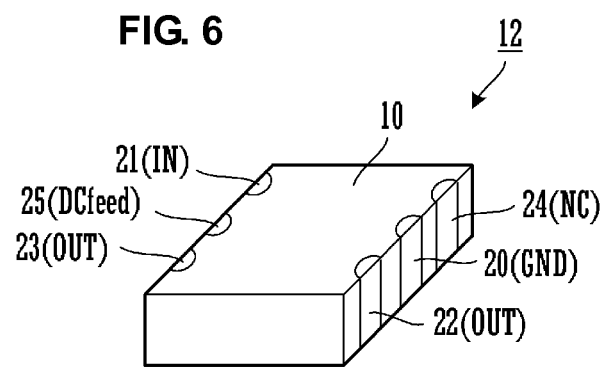
FIG. 6 is a perspective view of the laminated balance filter according to the second preferred embodiment of the present invention.

FIG. 6 is a perspective view of a laminated balance filter 12 according to the second preferred embodiment.

By laminating the dielectric layers 251, 242, 241, 271, 242, 211, 201, and 221 in which various types of electrode patterns are provided as illustrated in FIG. 5, a multilayer body 10 is configured as illustrated in FIG. 6. In addition, a ground terminal 20, an unbalanced input terminal 21, balanced output terminals 22 and 23, a power-supply terminal 25, and an open terminal 24 are preferably disposed on two opposed side surfaces (end surfaces) of four side surfaces of the multilayer body 10, thereby configuring the laminated balance filter 12.

Figure 7:
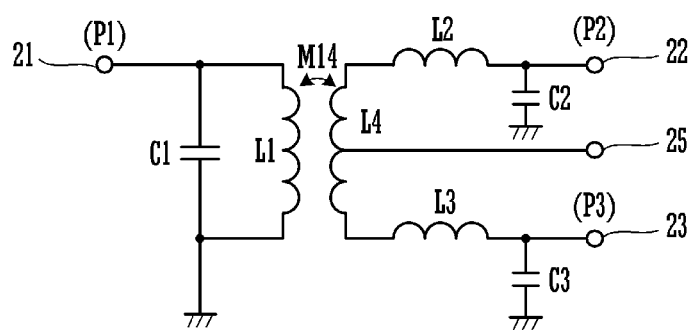
FIG. 7 is an equivalent circuit diagram of the laminated balance filter according to the second preferred embodiment of the present invention.

FIG. 7 is an equivalent circuit diagram of the laminated balance filter 12 illustrated in FIGS. 5 and 6. In FIG. 7, an inductor L4 corresponds to the coil 142 located in the center of the balanced side coils illustrated in FIG. 5. The center of the inductor L4 is connected to the power-supply terminal 25. The remaining configuration is the same or substantially the same as that in the first preferred embodiment.

With the laminated balance filter according to the second preferred embodiment, a bias voltage can be supplied from the power-supply terminal 25 to a differential amplifier circuit (IC chip) connected to the balanced terminals 22 and 23.

Third Preferred Embodiment

Figure 8:
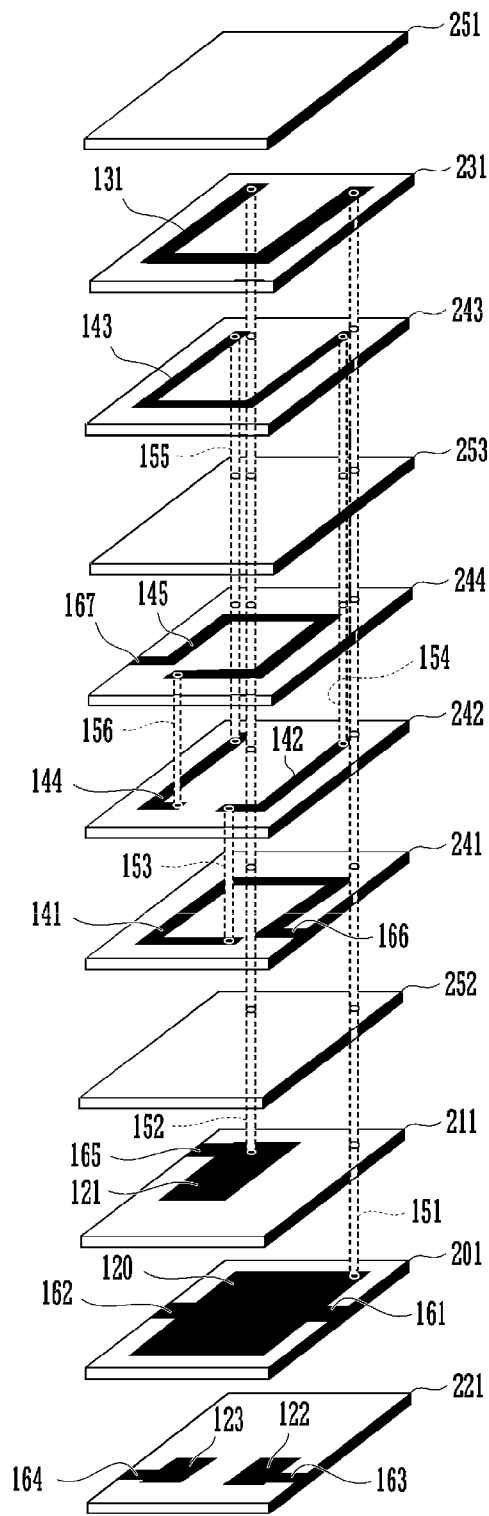
FIG. 8 is an exploded perspective view of a laminated balance filter according to a third preferred embodiment of the present invention.

FIG. 8 is an exploded perspective view of a laminated balance filter according to a third preferred embodiment of the present invention.

As illustrated in FIG. 8, the laminated balance filter includes a multilayer body including a plurality of laminated dielectric layers 251, 231, 243, 253, 244, 242, 241, 252, 211, 201, and 221 in which electrode patterns are provided.

In the dielectric layer 211, a first capacitor electrode 121 is provided. The capacitor electrode 121 extends to the left side of the dielectric layer 211 through an extraction electrode 165. A ground electrode 120 is provided in the dielectric layer 201. The ground electrode 120 extends to the right and left sides of the dielectric layer 201 through extraction electrodes 161 and 162. A second capacitor electrode 122 and a third capacitor electrode 123 are provided in the dielectric layer 221. The second capacitor electrode 122 extends to the right side of the dielectric layer 221 through an extraction electrode 163. The third capacitor electrode 123 extends to the left side of the dielectric layer 221 through an extraction electrode 164.

The first capacitor electrode 121 and the ground electrode 120 are preferably arranged opposite to each other, thereby defining a first capacitor. The second capacitor electrode 122 and the ground electrode 120 are preferably arranged opposite to each other, thereby defining a second capacitor. Similarly, the third capacitor electrode 123 and the ground electrode 120 are preferably arranged opposite to each other, thereby defining a third capacitor.

In the dielectric layer 231, an unbalanced side coil 131 is provided.

A via electrode 151 is provided in the dielectric layers 231, 243, 253, 244, 242, 241, 252, and 211. In addition, a via electrode 152 is provided in the dielectric layers 231, 243, 253, 244, 242, 241, and 252. A first end portion of the unbalanced side coil 131 is conductively connected to the ground electrode 120 through the via electrode 151. A second end portion of the unbalanced side coil 131 is conductively connected to the first capacitor electrode 121 through the via electrode 152.

The first capacitor electrode 121 and the ground electrode 120 define an unbalanced side capacitor. An LC parallel resonator is defined by the unbalanced side capacitor, the unbalanced side coil 131, and the via electrodes 151 and 152.

In addition, a coil 141 is provided in the dielectric layer 241, balanced side coils 142 and 144 are provided in the dielectric layer 242, a balanced side coil 145 is provided in the dielectric layer 244, and a balanced side coil 143 is provided in the dielectric layer 243. A via electrode 153 is provided in the dielectric layer 242, a via electrode 154 is provided in the dielectric layers 242, 244, 253, and 243, and a via electrode 155 is provided in the dielectric layers 244, 253, and 243.

A first end portion of the balanced side coil 141 extends to the right side of the dielectric layer 241 through the extraction electrode 166. A second end portion of the balanced side coil 141 is conductively connected to a first end portion of the balanced side coil 142 through the via electrode 153. A second end portion of the balanced side coil 142 is conductively connected to a first end portion of the balanced side coil 143 through the via electrode 154. A second end portion of the balanced side coil 143 is conductively connected to a first end portion of the balanced side coil 144 through the via electrode 155. A second end portion of the balanced side coil 144 is conductively connected to a first end portion of the balanced side coil 145 through a via electrode 156. A second end portion of the balanced side coil 145 extends to the left side of the dielectric layer 244 through the extraction electrode 167.

The balanced side coils 141 to 145 preferably have a substantially helical shape, and are wound in the same winding directions. The coil 143 located in the center of the balanced side coils 141 to 145 is disposed near the unbalanced side coil 131, thereby being electromagnetic-field-coupled to the unbalanced side coil 131.

The arrangement of the external terminals of the laminated balance filter according to the third preferred embodiment is the same as that illustrated in FIG. 3.

According to the third preferred embodiment, the following advantageous effects are obtained.

Since the coil 143 located in the center of the balanced side coils is disposed in the uppermost layer of the electrode layers in which the balanced side coils are provided, the center coil located in the center of the balanced side coils can be arranged without being expanded in a planar direction, and thus, the overall size of the laminated balance filter is reduced.

Since the center coil 142 located in the center of the balanced side coils is disposed near the unbalanced side coil 131 at least a portion of which overlaps with the center coil 142 when viewed in the laminating direction of electrode layers, the thickness of dielectric or the area of overlapping portions of two coils is fixed, thereby obtaining desirable electromagnetic coupling. In addition, by coupling the two coils to each other in a thickness direction, the size of a multilayer body in a planar direction is reduced.

Since the dielectric layer 253 is disposed between the dielectric layer 243 in which the coil 143 located in the center of the balanced side coils is provided and the dielectric layers in which the other coils in the balanced side coils are provided, the unbalanced side coil 131 is strongly coupled to the coil 143 located in the center of the balanced side coils, and thus, unnecessary coupling between the unbalanced side coil 131 and the other coils in the balanced side coils is effectively prevented.

Fourth Preferred Embodiment

Figure 9:
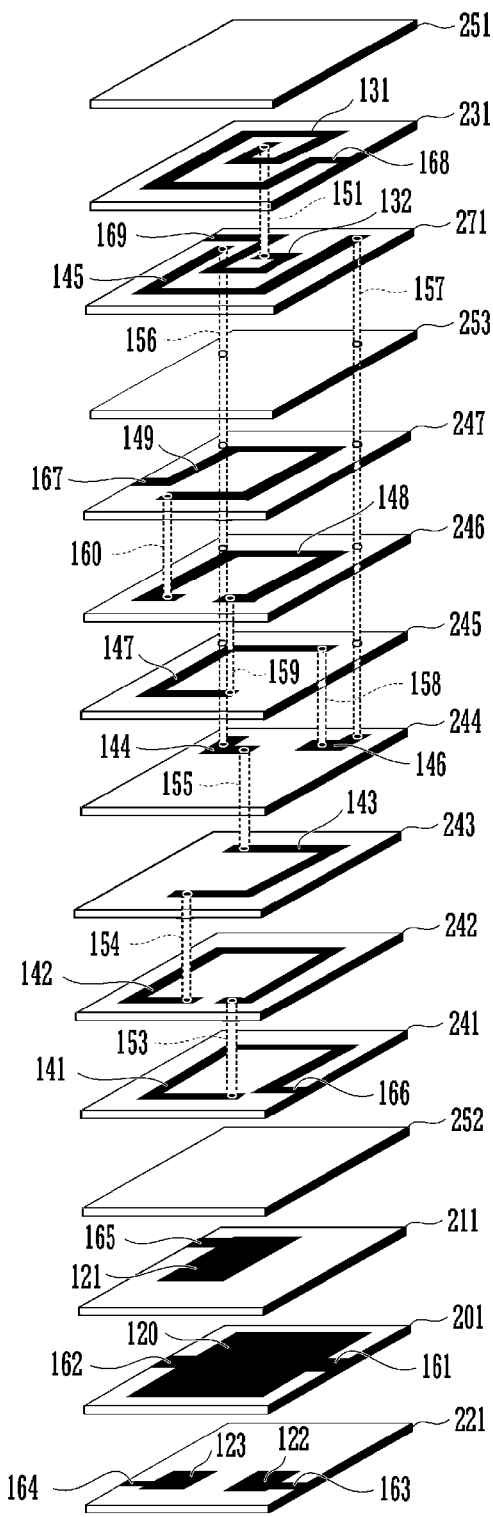
FIG. 9 is an exploded perspective view of a laminated balance filter according to a fourth preferred embodiment of the present invention.

FIG. 9 is an exploded perspective view of a laminated balance filter according to a fourth preferred embodiment of the present invention.

As illustrated in FIG. 9, the laminated balance filter includes a multilayer body including a plurality of laminated dielectric layers 251, 231, 271, 253, 247, 246, 245, 244, 243, 242, 241, 252, 211, 201, and 221 in which electrode patterns are provided.

In the dielectric layer 211, a first capacitor electrode 121 is provided. The capacitor electrode 121 extends to the left side of the dielectric layer 211 through an extraction electrode 165. A ground electrode 120 is provided in the dielectric layer 201. The ground electrode 120 extends to the right and left sides of the dielectric layer 201 through extraction electrodes 161 and 162. A second capacitor electrode 122 and a third capacitor electrode 123 are provided in the dielectric layer 221. The second capacitor electrode 122 extends to the right side of the dielectric layer 221 through an extraction electrode 163. The third capacitor electrode 123 extends to the left side of the dielectric layer 221 through an extraction electrode 164.

The first capacitor electrode 121 and the ground electrode 120 are arranged opposite to each other, thereby defining a first capacitor. The second capacitor electrode 122 and the ground electrode 120 are arranged opposite to each other, thereby defining a second capacitor. Similarly, the third capacitor electrode 123 and the ground electrode 120 are arranged opposite to each other, thereby defining a third capacitor.

In the dielectric layer 231, an unbalanced side coil 131 having a substantially spiral shape is provided. In addition, in the dielectric layer 271, an unbalanced side coil 132 having a substantially spiral shape is provided. A via electrode 151 is provided in the dielectric layer 231.

An outer peripheral end of the unbalanced side coil 131 preferably extends to the approximate center of the right side of the dielectric layer 231 through an extraction electrode 168. Accordingly, the outer peripheral end of the unbalanced side coil 131 is conductively connected to the ground electrode 120 through an outer electrode on the side surface of the multilayer body.

An inner peripheral end of the unbalanced side coil 131 is conductively connected to an inner peripheral end of the unbalanced side coil 132 through the via electrode 151. An outer peripheral end of the unbalanced side coil 132 extends to the left side of the dielectric layer 271 through an extraction electrode 169. Accordingly, the outer peripheral end of the balanced side coil 132 is conductively connected to the first capacitor electrode 121 through an outer electrode on the side surface of the multilayer body.

The first capacitor electrode 121 and the ground electrode 120 define an unbalanced side capacitor. An LC parallel resonator is defined by the unbalanced side capacitor, the unbalanced side coils 131 and 132, and the via electrode 151.

In addition, a balanced side coil 141 is provided in the dielectric layer 241, a balanced side coil 142 is provided in the dielectric layer 242, a balanced side coil 143 is provided in the dielectric layer 243, balanced side coils 144 and 146 are provided in the dielectric layer 244, a balanced side coil 147 is provided in the dielectric layer 245, a balanced side coil 148 is provided in the dielectric layer 246, and a balanced side coil 149 is provided in the dielectric layer 247. A via electrode 153 is provided in the dielectric layer 242, a via electrode 154 is provided in the dielectric layer 243, a via electrode 155 is formed in the dielectric layer 244, a via electrode 158 is provided in the dielectric layer 245, a via electrode 159 is provided in the dielectric layer 246, and a via electrode 160 is provided in the dielectric layer 247.

The balanced side coils are conductively connected from the extraction electrode 166 to the extraction electrode 167 through the balanced side coil 141, the via electrode 153, the balanced side coil 142, the via electrode 154, the balanced side coil 143, the via electrode 155, the balanced side coil 144, the via electrode 156, the balanced side coil 145, the via electrode 157, the balanced side coil 146, the via electrode 158, the balanced side coil 147, the via electrode 159, the balanced side coil 148, the via electrode 160, and the balanced side coil 149, in this order.

In this manner, each of the balanced side coils 141 to 149 have a substantially helical shape and are wound in the same winding directions. The coil 145 located in the center of the nine balanced side coils 141 to 149 is preferably close to the unbalanced side coil 131 in a laminating direction, and is preferably close to the unbalanced side coil 132 in a planar direction. Accordingly, the center coil 145 is electromagnetic-field-coupled to the unbalanced side coils 131 and 132.

The arrangement of the external terminals of the laminated balance filter according to the fourth preferred embodiment is the same or substantially the same as that illustrated in FIG. 3.

According to the fourth preferred embodiment, the following advantageous effects are obtained.

Since the unbalanced side coils are disposed in a plurality of layers, the area in which the unbalanced side coils are disposed is reduced.

Since the unbalanced side coils have a substantially spiral shape the axis of which corresponds to the laminating direction of the multilayer body, the impedance at the unbalanced side can be increased without increasing the area in which the unbalanced side coils are provided.

Fifth Preferred Embodiment

Figure 10:
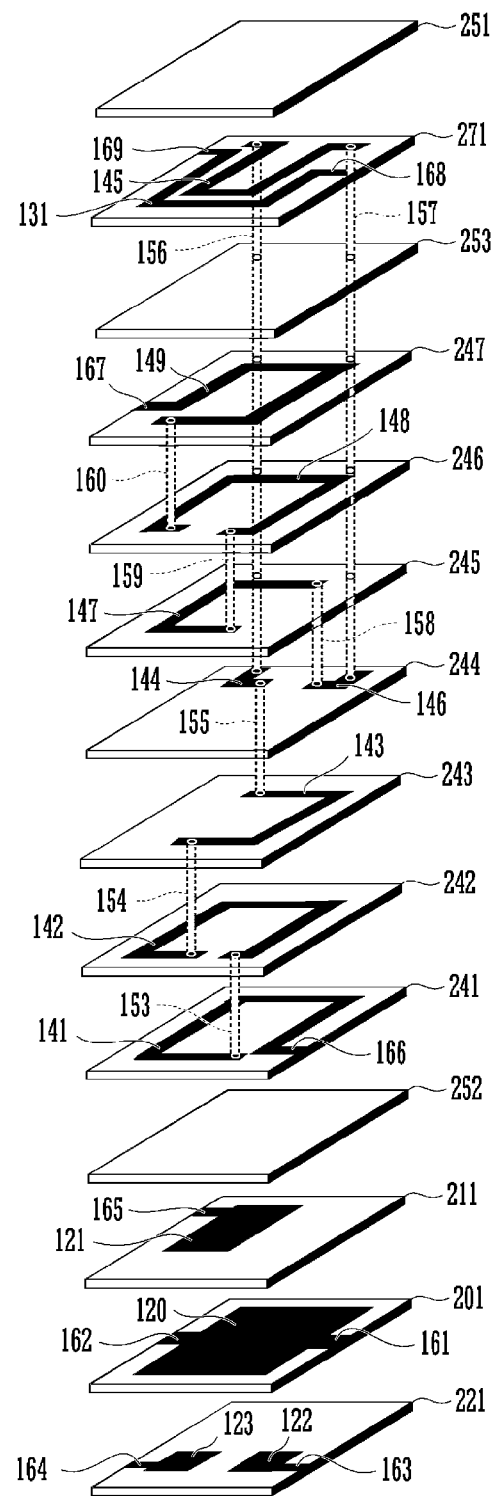
FIG. 10 is an exploded perspective view of a laminated balance filter according to a fifth preferred embodiment of the present invention.

FIG. 10 is an exploded perspective view of a laminated balance filter according to a fifth preferred embodiment of the present invention.

As illustrated in FIG. 10, the laminated balance filter includes a multilayer body including a plurality of laminated dielectric layers 251, 271, 253, 247, 246, 245, 244, 243, 242, 241, 252, 211, 201, and 221 in which electrode patterns are provided.

The laminated balance filter of the fifth preferred embodiment is different from the laminated balance filter of the fourth preferred embodiment illustrated in FIG. 9 in that the unbalanced side coil 131 is provided in one layer, and is disposed in the same layer in which the center coil 145 located in the center of the balanced side coils is provided. The remaining configuration is the same or substantially the same as that in the fourth preferred embodiment.

According to the fifth preferred embodiment, the coil 145 located in the center of the balanced side coils and the unbalanced side coil 131 are arranged near each other in an in-plane direction in the same electrode layer at a location at which the coil 145 and the unbalanced side coil 131 are electromagnetically coupled to each other. Therefore, the deviation of a coupling amount, due to lamination misalignment when the electrode layers sandwich the dielectric layer and are opposed to each other, does not occur, and thus, a stable coupling amount is obtained.

In addition, a potion of the unbalanced side coil 131 may preferably be disposed in the same plane on which the unbalanced side coils are disposed. In addition, a potion of the unbalanced side coil may preferably be disposed in the same plane on which the center coil located in the center of the balanced side coils is disposed.

Sixth Preferred Embodiment

Figure 11:
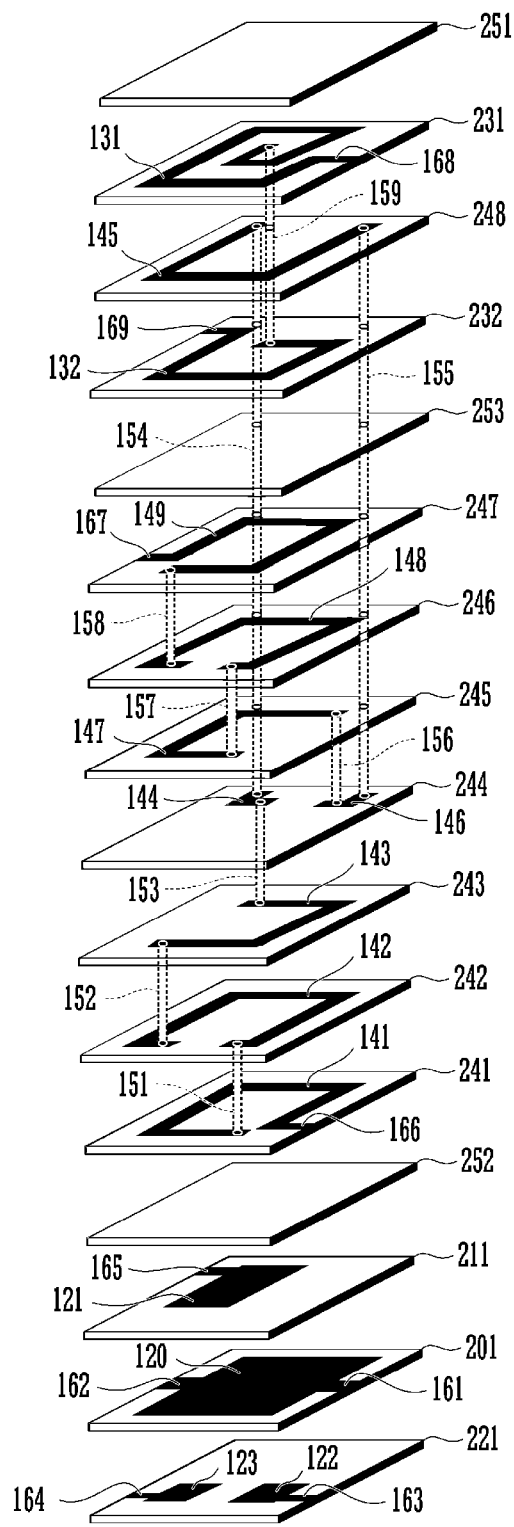
FIG. 11 is an exploded perspective view of a laminated balance filter according to a sixth preferred embodiment of the present invention.

FIG. 11 is an exploded perspective view of a laminated balance filter according to a sixth preferred embodiment of the present invention.

As illustrated in FIG. 11, the laminated balance filter includes a multilayer body including a plurality of laminated dielectric layers 251, 231, 248, 232, 253, 247, 246, 245, 244, 243, 242, 241, 252, 211, 201, and 221 in which electrode patterns are provided.

The laminated balance filter of the sixth preferred embodiment is different from the laminated balance filter of the fourth preferred embodiment illustrated in FIG. 9 in the configuration of a coupling portion between the center coil located in the center of the balanced side coils and the unbalanced side coils. As illustrated in FIG. 11, the unbalanced side coil 131 and the unbalanced side coil 132 are provided in the dielectric layer 231 and the dielectric layer 232, respectively, and the coil 145 located in the center of the balanced side coils is provided in the dielectric layer 248 located between the two dielectric layers 231 and 232.

The remaining configuration is the same or substantially the same as that in the fourth preferred embodiment.

According to the sixth preferred embodiment, since the coil located in the center of the balanced side coils is disposed at a location at which the coil is sandwiched between a plurality of electrode layers, coupling between the coil 145 located in the center of the balanced side coils and the unbalanced side coils 131 and 132 is increased, and thus, wide bandwidth characteristics are easily obtained.

Figure 12A:
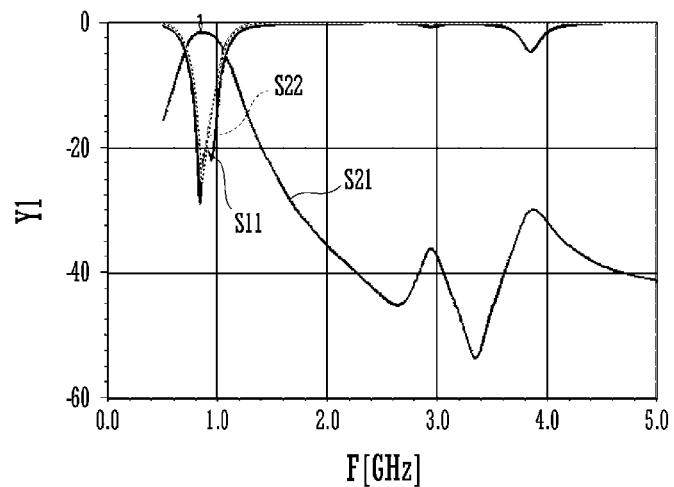
FIGS. 12A to 12C are electrical characteristic diagrams of the laminated balance filter according to the sixth preferred embodiment of the present invention.
Figure 12B:
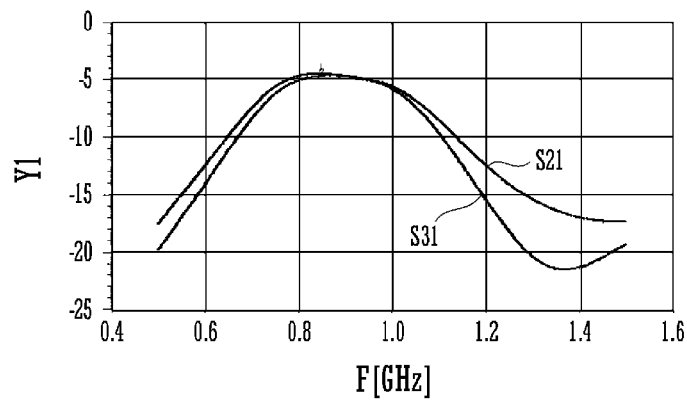
Figure 12C:
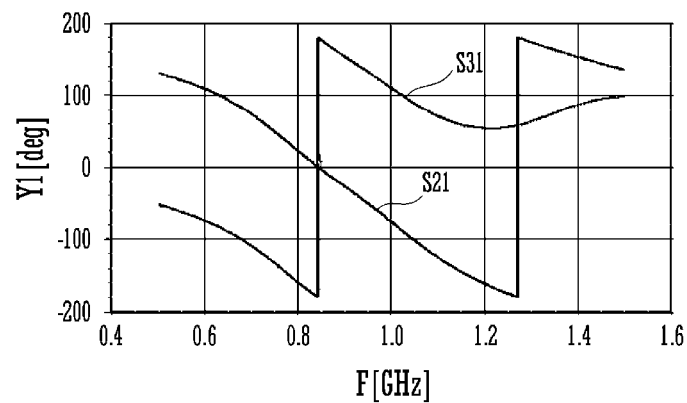

FIGS. 12A to 12C are electrical characteristic diagrams of the laminated balance filter according to the sixth preferred embodiment. Here, as port numbers, a port P1 is assigned to an unbalanced input port, and ports P2 and P3 are assigned to balanced output ports. In addition, FIGS. 12A to 12C illustrate S11 characteristics (reflection characteristics at an input port side), S21 characteristics (an insertion loss between the ports P1 and P2 in a differential mode between the balanced output port P2 and the balanced output port P3), S31 characteristics (an insertion loss between the ports P1 and P3 in a differential mode between the balanced output port P2 and the balanced output port P3), and S22 characteristics (a return loss at an output port side), which are related to scattering (S) parameters. A relationship between the individual ports P1, P2, and P3 and an equivalent circuit is illustrated in FIG. 4.

FIG. 12A illustrates the individual amplitude characteristics of the S11, S21, and S22. FIG. 12B is a diagram in which a horizontal axis and a vertical axis are magnified with respect to the amplitude characteristics of the S21 and the S31. The units of the vertical axes in FIGS. 12A and 12B are decibels, and the standard values thereof correspond to 0 [dB]. FIG. 12C illustrates the phase characteristics of the S21 and S31.

As illustrated in FIG. 12A, the S11 and S22 are greatly attenuated at an operating frequency band of about 0.85 GHz, and thus, the impedance is likely to be matched at the unbalanced input port P1 and the balanced output ports P2 and P3.

In addition, as illustrated in FIG. 12B, the insertion losses of the S11 and S31 are substantially the same at the operating frequency band of about 0.85 GHz, and thus, the balanced output ports P2 and P3 are likely to be balanced.

In addition, as illustrated in FIG. 12C, in a phase relationship between the balanced output ports P2 and P3, a phase difference of about 180 degrees is maintained across a wide frequency band, and thus, signals balanced between the balanced output ports P2 and P3 are likely to be output across the wide frequency band.

Seventh Preferred Embodiment

Figure 13:
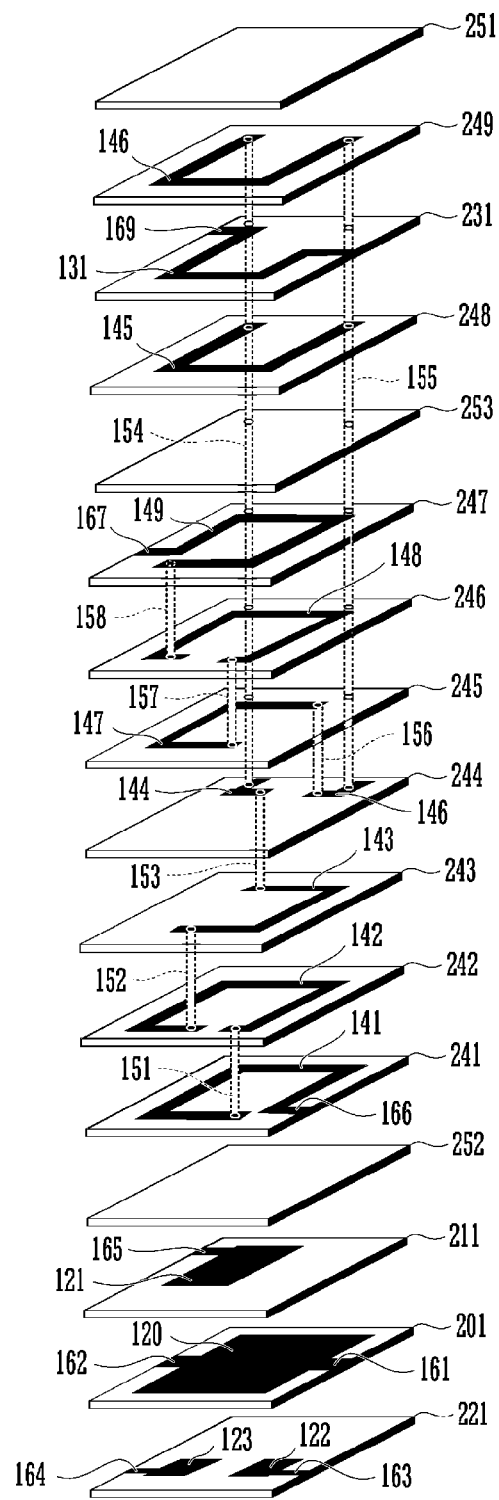
FIG. 13 is an exploded perspective view of a laminated balance filter according to a seventh preferred embodiment of the present invention.

FIG. 13 is an exploded perspective view of a laminated balance filter according to a seventh preferred embodiment of the present invention.

As illustrated in FIG. 13, the laminated balance filter includes a multilayer body including a plurality of laminated dielectric layers 251, 249, 231, 248, 253, 247, 246, 245, 244, 243, 242, 241, 252, 211, 201, and 221 in which electrode patterns are provided.

The laminated balance filter of the seventh preferred embodiment is different from the laminated balance filter of the fourth preferred embodiment illustrated in FIG. 9 in the configuration of a coupling portion between the coils located in the center of the balanced side coils and the unbalanced side coils. In an example illustrated in FIG. 13, the coils 145 and 146 located in the center of balanced side coils are provided in the dielectric layers 248 and 249, respectively. The two coils 145 and 146 are connected in parallel to each other through via electrodes 154 and 155. The unbalanced side coil 131 is provided in the dielectric layer 231 between the two dielectric layers 248 and 249.

The remaining configuration is the same or substantially the same as that in the fourth preferred embodiment.

According to the seventh preferred embodiment, since the unbalanced side coil 131 is disposed at a location at which the unbalanced side coil 131 is sandwiched between the center coils 145 and 146 located in the center of a plurality of balanced side coils, coupling between the center coils 145 and 146 located in the center of the balanced side coils and the unbalanced side coil 131 can be increased, and thus, wide bandwidth characteristics are easily obtained.

While, in the above descriptions of the preferred embodiments, the unbalanced terminal is preferably used as the input terminal, and the balanced terminal is preferably used as the output terminal, the balanced terminal may be used as the input terminal, and the unbalanced terminal may be used as the output terminal.

In addition, while, in the preferred embodiments described above, examples are illustrated in which a single ground electrode preferably is provided, a first ground electrode to which the capacitor electrode at the unbalanced side is arranged opposite and a second ground electrode to which the capacitor electrode at the balanced side is disposed opposite may be separately provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated balance filter comprising:
   a plurality of dielectric layers;
   a plurality of electrode layers;
   a plurality of longitudinal conducting electrodes penetrating the plurality of dielectric layers in thickness directions thereof;
   one unbalanced terminal;
   two balanced terminals; and
   a ground terminal; wherein
   a ground electrode, a balanced side inductor, an unbalanced side inductor, and an unbalanced side capacitor electrode are defined by the plurality of electrode layers and the plurality of longitudinal conducting electrodes;
   the ground electrode is conductively connected to the ground terminal;
   a first end portion of the unbalanced side inductor is conductively connected to the unbalanced terminal, and a second end portion of the unbalanced side inductor is conductively connected to the ground electrode;
   the unbalanced side capacitor electrode is arranged at a location opposite to the ground electrode, and is conductively connected to the unbalanced terminal;
   the balanced side inductor is defined by a series circuit in which an odd number of inductors, including at least three inductors, are connected in series, and a first end portion and a second end portion of the inductor series circuit are conductively connected to the two balanced terminals, respectively; and
   a center inductor of the odd number of inductors is arranged at a location at which the center inductor is electromagnetic-field-coupled to the unbalanced side inductor, and the odd number of inductors include substantially helical-shaped coils having the same winding directions.

2. The laminated balance filter according to claim 1, wherein at least a portion of a coil included in the center inductor is disposed in an uppermost layer or a lowermost layer of a plurality of electrode layers in which the balanced side inductor is defined.

3. The laminated balance filter according to claim 1, wherein a coil included in the center inductor is disposed near a coil included in the unbalanced side inductor such that at least a portion of the coil included in the unbalanced side inductor overlaps the coil included in the center inductor in a laminating direction of the plurality of electrode layers.

4. The laminated balance filter according to claim 3, wherein the coil included in the center inductor includes a protruding portion that protrudes in the laminating direction of the plurality of electrode layers into regions of coils included in other inductors in the balanced side inductors, and the unbalanced side inductor is disposed near the protruding portion.

5. The laminated balance filter according to claim 3, wherein the coil included in the unbalanced side inductor is defined by the plurality of electrode layers, and an electrode layer in which the coil included in the center inductor is provided to be sandwiched between the plurality of electrode layers in which the coil included in the unbalanced side inductor is defined.

6. The laminated balance filter according to claim 3, wherein the coil included in the center inductor is defined by the plurality of electrode layers, and an electrode layer in which the coil included in the unbalanced side inductor is provided to be sandwiched between the plurality of electrode layers in which the coil included in the center inductor is defined.

7. The laminated balance filter according to claim 1, wherein a coil included in the center inductor and a coil included in the unbalanced side inductor are arranged near each other on a common electrode layer of the plurality of electrode layers at a location at which the coil included in the center inductor and the coil included in the unbalanced side inductor are electromagnetically coupled to each other.

8. The laminated balance filter according to claim 1, wherein a coil included in the unbalanced side inductor is defined by the plurality of electrode layers, and the plurality of electrode layers defining the coil included in the unbalanced side inductor are connected using the plurality of longitudinal conducting electrodes.

9. The laminated balance filter according to claim 1, wherein the unbalanced side inductor is defined by a substantially spiral-shaped coil having an axis extending in a laminating direction of the plurality of electrode layers.

10. The laminated balance filter according to claim 1, wherein two balanced side capacitor electrodes arranged at locations opposite to the ground electrode and conductively connected to the two balanced terminals, respectively, are defined by a predetermined electrode layer of the plurality of electrode layers.

* * * * *